United States Patent [19]

Coveley

[11] Patent Number: 5,548,821

[45] Date of Patent: *Aug. 20, 1996

[54] ADAPTIVE SYSTEM FOR SELF-TUNING AND SELECTING A CARRIER FREQUENCY IN A RADIO FREQUENCY COMMUNICATION SYSTEM

[76] Inventor: Michael Coveley, Suite 101, #16 Passy Crescent, North York, Ontario, Canada, M3J 1P3

[ * ] Notice: The term of this patent shall not extend beyond the expiration date of Pat. No. 5,438,699.

[21] Appl. No.: 310,702

[22] Filed: Sep. 22, 1994

Related U.S. Application Data

[63] Continuation-in-part of Ser. No. 195,026, Feb. 14, 1994, Pat. No. 5,438,699, which is a continuation-in-part of Ser. No. 895,593, Jun. 9, 1992, abandoned.

[51] Int. Cl.$^6$ .................................... H04B 17/00
[52] U.S. Cl. ................ 455/67.4; 455/63; 455/70; 455/186.1; 455/193.2; 455/193.3; 455/226.1
[58] Field of Search .................... 455/63, 67.1, 67.4, 455/68, 70, 71, 88, 182.3, 184.1, 185.1, 186.1, 193.1, 193.2, 193.3, 195.1, 197.2, 336, 215, 50.1, 67.3, 296, 226.1, 34.1, 34.2, 62

[56] References Cited

U.S. PATENT DOCUMENTS

| | | | |
|---|---|---|---|
| 3,671,868 | 6/1972 | Saunders | 455/336 |
| 4,210,898 | 7/1980 | Betts | 455/99 |
| 4,850,030 | 7/1989 | Hashimoto et al. | 455/34.2 |
| 5,105,162 | 4/1992 | Fleissner | 455/336 |
| 5,146,613 | 9/1992 | Anderson | 455/78 |
| 5,438,699 | 8/1995 | Coveley | 455/67.4 |

Primary Examiner—Reinhard J. Eisenzopf
Assistant Examiner—Nguyen Vo
Attorney, Agent, or Firm—Stephen J. Perry; Sim & McBurney

[57] ABSTRACT

A system for adaptive self-tuning of a receiver in a radio communication system. Prior to transmission of each data packet from a transmitter to a receiver, the transmitter generates a sequence of predefined test bytes (test sequence) n times at an initial carrier frequency. An identical version of the predefined test sequence is stored in the receiver. Circuitry is provided in the receiver for selected predefined states of tuning impedances for varying the center operating frequency of the receiver, wherein the predefined states of tuning impedances are equal in number to the predefined number of test sequences. A microcontroller in the receiver compares the received test sequence with the stored test sequence and creates a tuning table correlating respective states of the receiver tuning impedances with error bits detected in each state. The microcontroller then selects the tuning impedance state characterized by the least number of error bits, thereby selecting the optimal receiver center operating frequency to the initial carrier frequency generated by the transmitter. After the data has been transmitted by the transmitter at the initial carrier frequency and received by the receiver at the optimal center frequency, error detection is performed on the data. If the data has been received incorrectly, the transmitter changes its carrier frequency, the receiver changes its center frequency correspondingly, and the adaptive tuning test sequence is repeated.

1 Claim, 10 Drawing Sheets

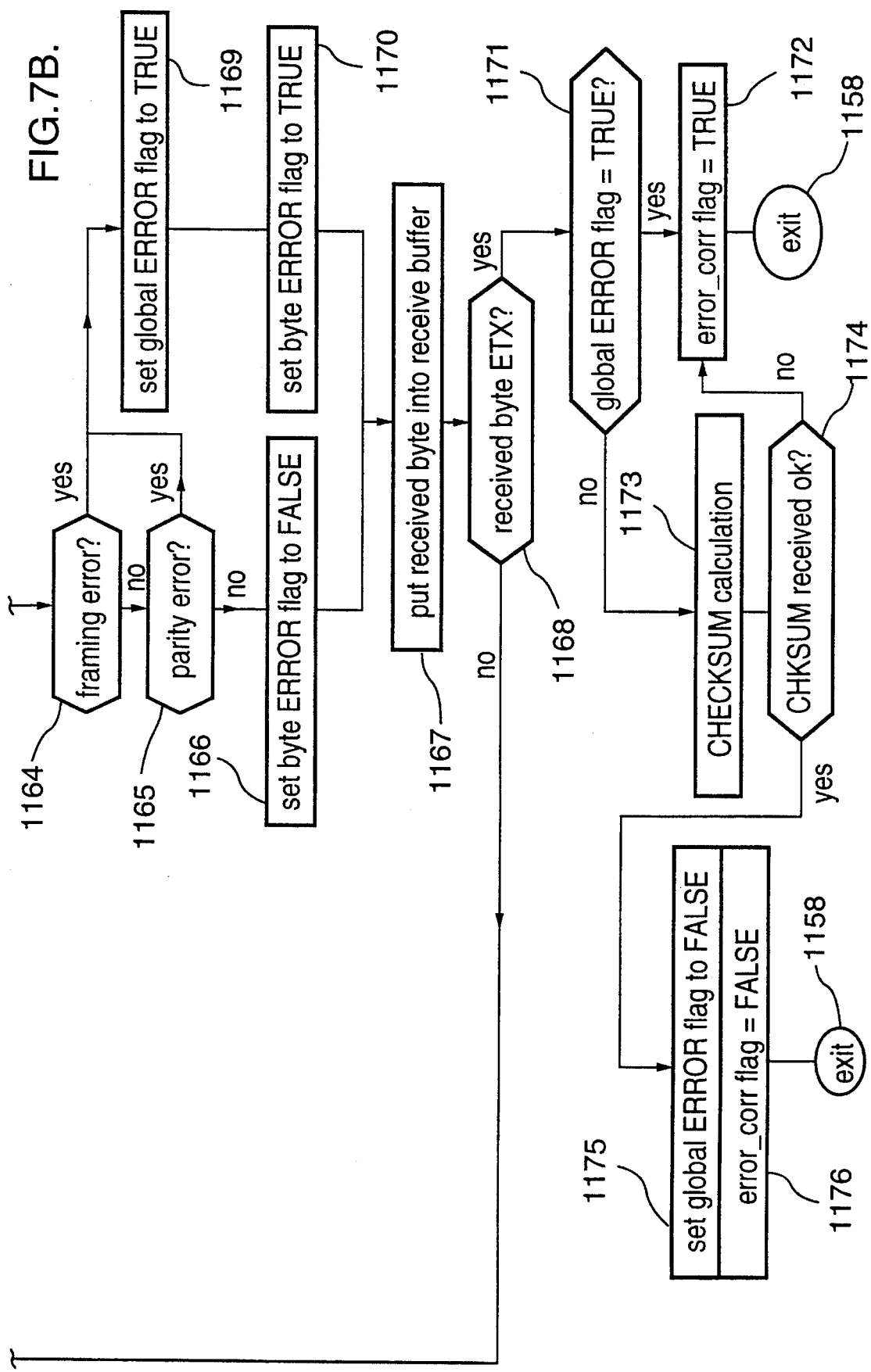

ADAPTIVE SYSTEM FOR SELF-TUNING AND SELECTING A CARRIER FREQUENCY IN A RADIO FREQUENCY COMMUNICATION SYSTEM

CROSS REFERENCE TO RELATED APPLICATION

This is a continuation-in-part of application Ser. No. 08/195,026 filed Feb. 14, 1994, entitled ADAPTIVE SYSTEM FOR SELF-TUNING A RECEIVER IN AN RF COMMUNICATION SYSTEM, patented on Aug. 1, 1995 under U.S. Pat. No. 5,438,699, which is a continuation-in-part of application Ser. No. 07/895,593 filed Jun. 9, 1992, entitled HYP-77/87 MICRO TRANSMITTER 7 HYP-300 HYPEREGENERATIVE RECEIVER, now abandoned.

FIELD OF THE INVENTION

This invention relates in general to communication systems, and more particularly to a system for real-time automatic self-tuning of a receiver to a transmitter carrier frequency.

BACKGROUND OF THE INVENTION

Superegenerative radio frequency techniques are well known in the art of radio communication. Systems operating in accordance with superegenerative radio frequency techniques continue to be manufactured in extremely large quantities for serving a variety of short range RF applications. The popularity of such regenerative radio frequency techniques is due primarily to simplicity of design and low manufacturing costs. Examples of superegenerative radio frequency systems may be found in U.S. Pat. No. 3,671,868 (Saunders); U.S. Pat. No. 5,146,613 (Anderson) and U.S. Pat. No. 4,210,898 (Betts).

However, superegenerative radio systems are subject to frequency drift and unrestrained bandwidth problems as a result of environmental changes and the aging of components within the radio circuitry. This often results in undependability of the systems and potentially critical deficiencies within relatively short periods of duty.

A further prior art superegenerative receiver is disclosed in U.S. Pat. No. 5,105,162 (Fleissner et al). In this Patent, a system is provided for automatically tuning the centre operating frequency of the receiver prior to production. In Fleissner et al, a signal generator and spectrum analyzer are used to permanently set the receiver to the desired centre operating frequency.

Thus, Fleissner et al provides an electronically locked tuning frequency as contrasted with prior art mechanically locked systems such as epoxied inductor cores, spring loaded capacitor/resistor barrels, etc. Once the centre operating frequency of the receiver has been permanently set, ageing components and temperature changes in the receiver will eventually result in the well known dependability problems of the prior art superegenerative receivers discussed above.

SUMMARY OF THE INVENTION

According to the present invention, a system is provided for real time automatic self-tuning of the receiver for optimal reception with respect to the carrier frequency of an associated transmitter. The system of the present invention is adaptive in that self-tuning of the receiver centre operating frequency is effected prior to each transmission of an information signal by the transmitter. Thus, the system of the present invention overcomes the prior art disadvantages of receiver centre operating frequency drift due to component ageing and temperature changes over time. Furthermore, the system of the present invention allows for signal reception from transmitters having slightly different carrier frequencies since the system provides for self tuning of the receiver prior to each transmission.

In accordance with a general aspect of the invention, the transmitter generates and transmits a predetermined number n of test sequences prior to each data transmission. The receiver incorporates a controller for storing an identical test sequence and circuitry for selecting between a like number of tuning impedances for tuning the receiver to receive the test sequences generated by the transmitter at respective slightly different centre operating frequencies set by the tuning impedances. The controller in the receiver then compares the received test sequences with the stored test sequence and calculates the number of bit errors for each test sequence. A table is created in the controller for correlating the bit errors with the associated selected tuning impedances, and the tuning impedance which is characterized by the least number of bit errors is selected for establishing the receiver centre operating frequency which is closest to the transmitter carrier frequency.

According to a further aspect of the invention, if a data packet has still not been received correctly after establishing the preferred tuning frequency for a given transmission carrier frequency (ie. the tuning frequency selection resulting in the fewest errors during the test sequence), the transmitter and receiver automatically select a new carrier frequency for transmission in an effort to optimize the transmission and reception frequencies for given environmental conditions (e.g. weather, geography, etc.). Once the new operating frequency has been selected, the adaptive tuning algorithm referred to above is repeated for further optimizing data reception.

In one embodiment of the invention, the transmitter and receiver are combined in the form of a transceiver. In a second embodiment of the invention, the transmitter and receiver are separate.

The tuning impedances may be realized using any of a number of well known arrangements of components. For example, a plurality of inductors may be connected in parallel with the primary tuning inductor of the superegenerative receiver in a plurality of configurations by means of a switch array. In another embodiment, the impedances may be set by means of a tuning voltage applied to a varactor diode connected in parallel with the primary tuning capacitor. In a further embodiment a plurality of resistors may be connected in various configurations via a switch array in parallel with an LC tuning circuit of the superegenerative receiver. Other tuning impedance configurations are possible as discussed in greater detail below.

BRIEF DESCRIPTION OF THE DRAWINGS

A detailed description of the preferred embodiment is provided in detail below with reference to the following drawings, in which.

3

Figure 3:
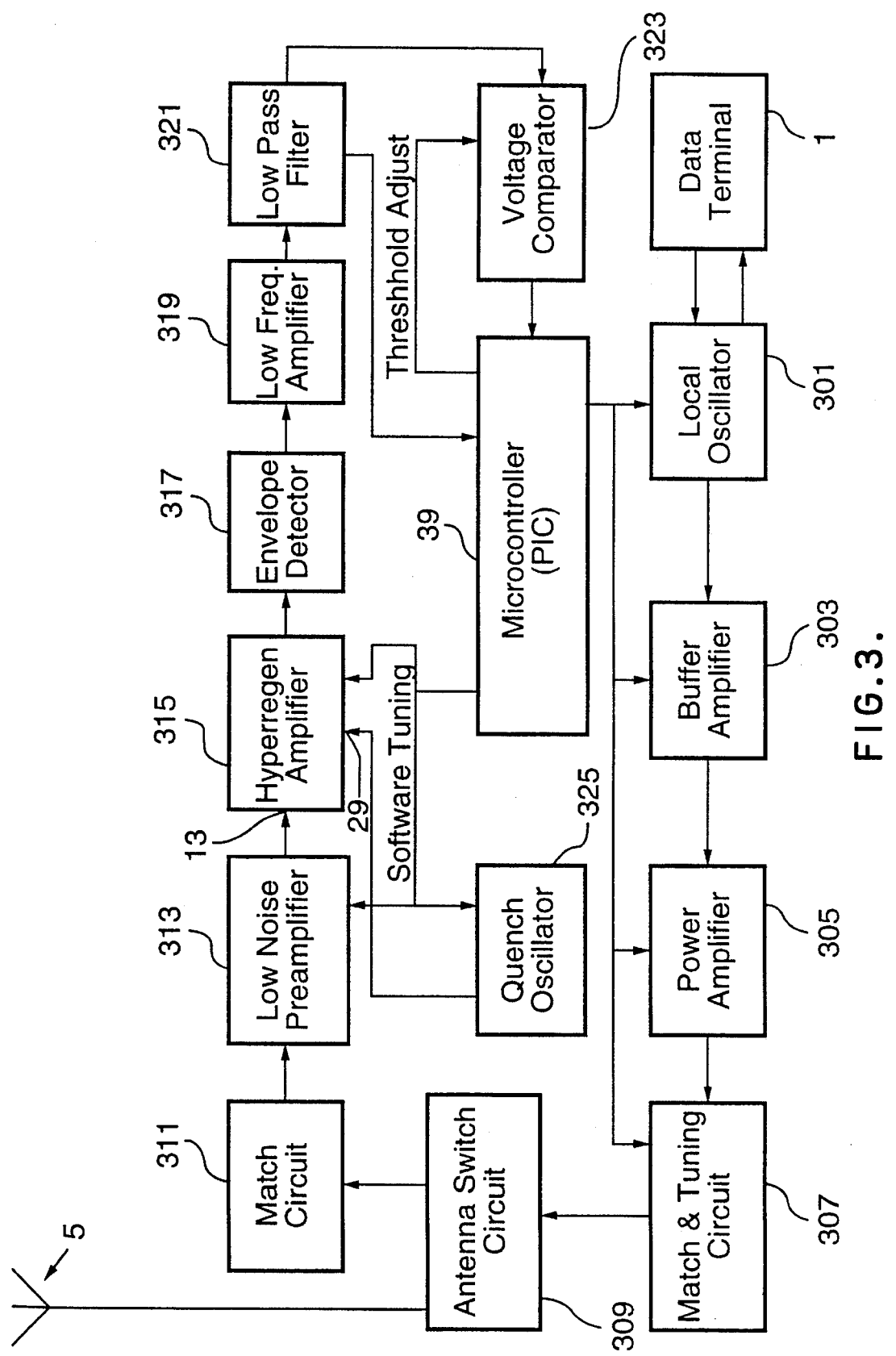
Figures 4, 5:
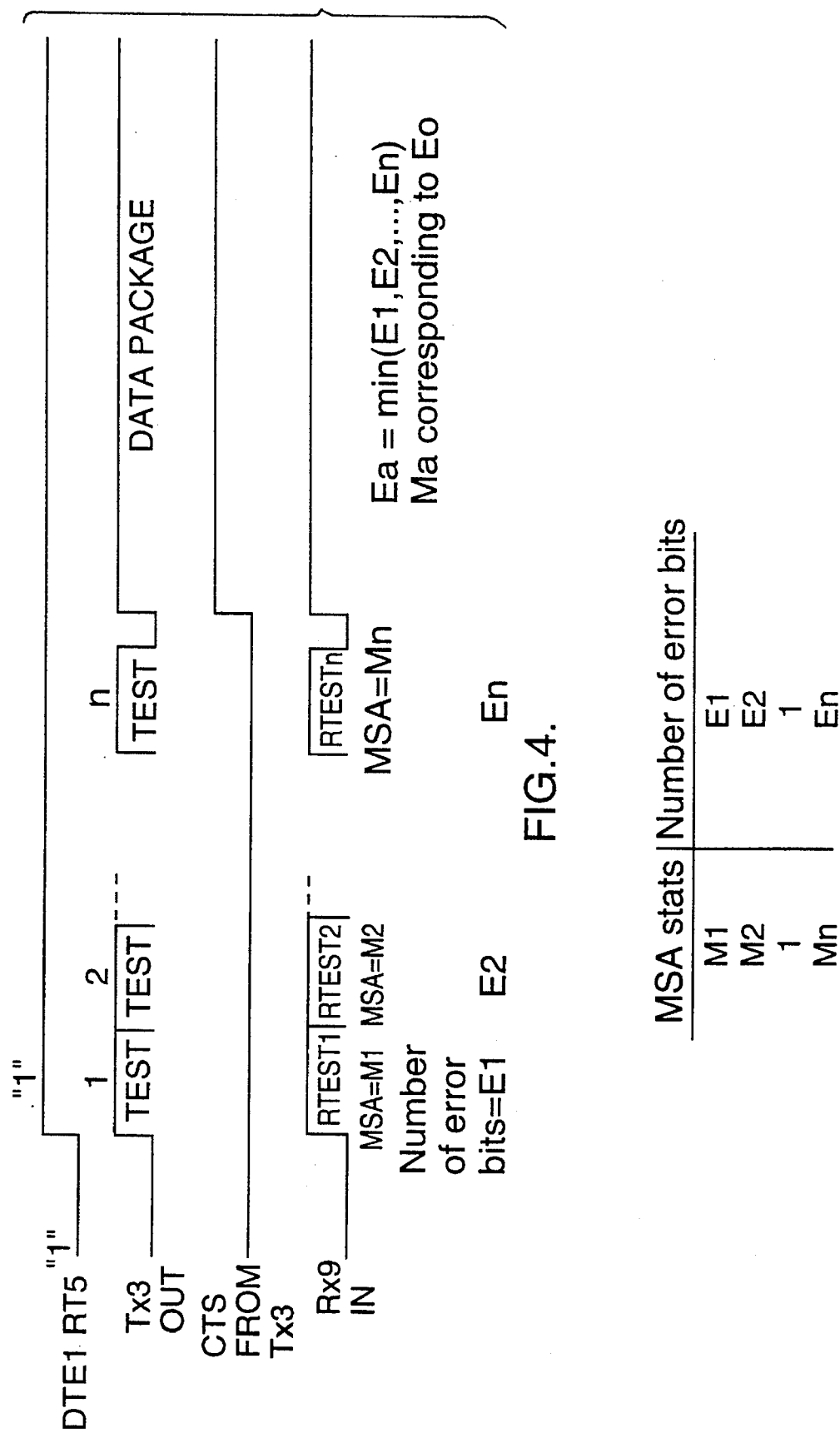
Figure 6A:
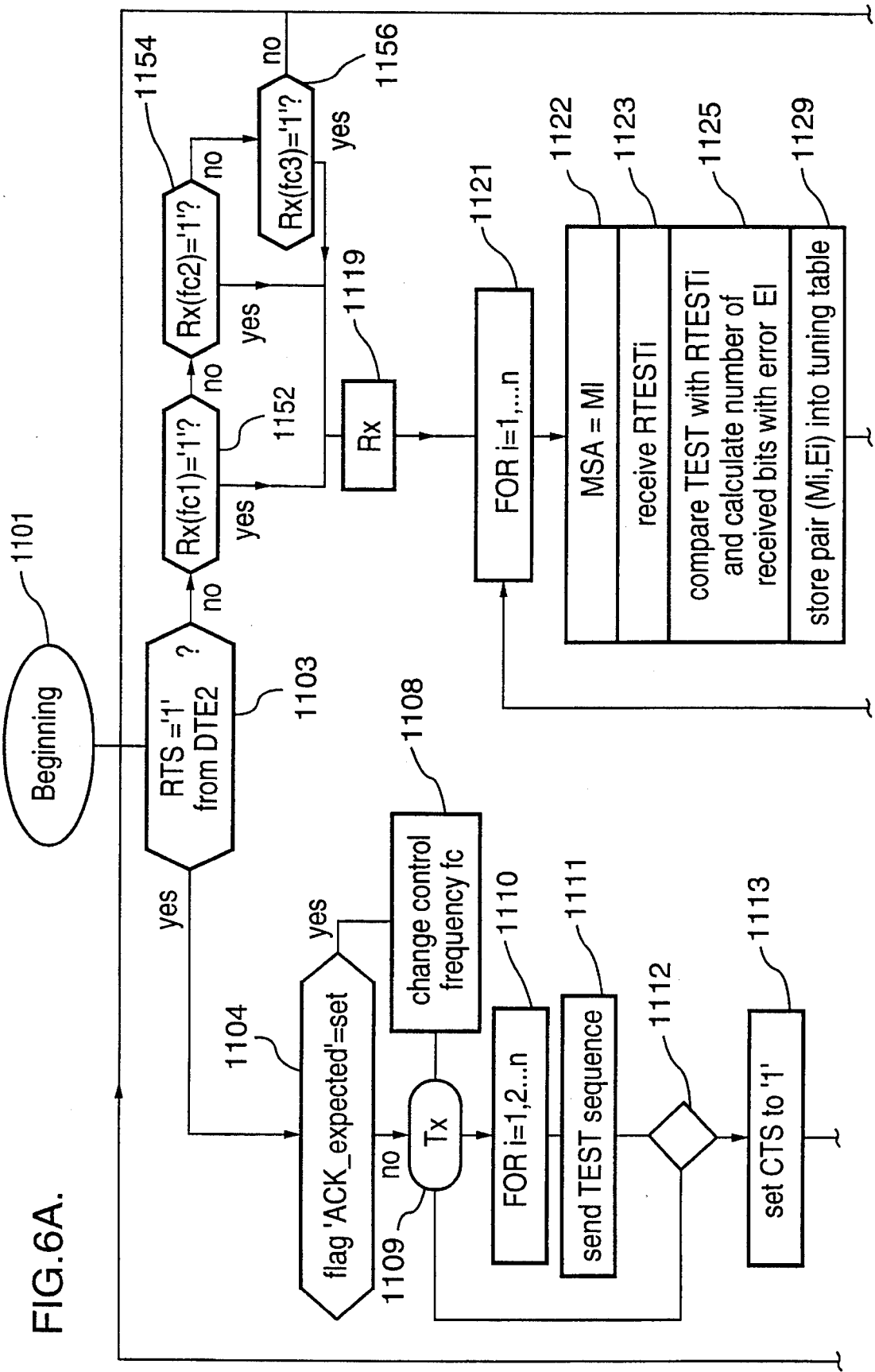
Figure 6B:
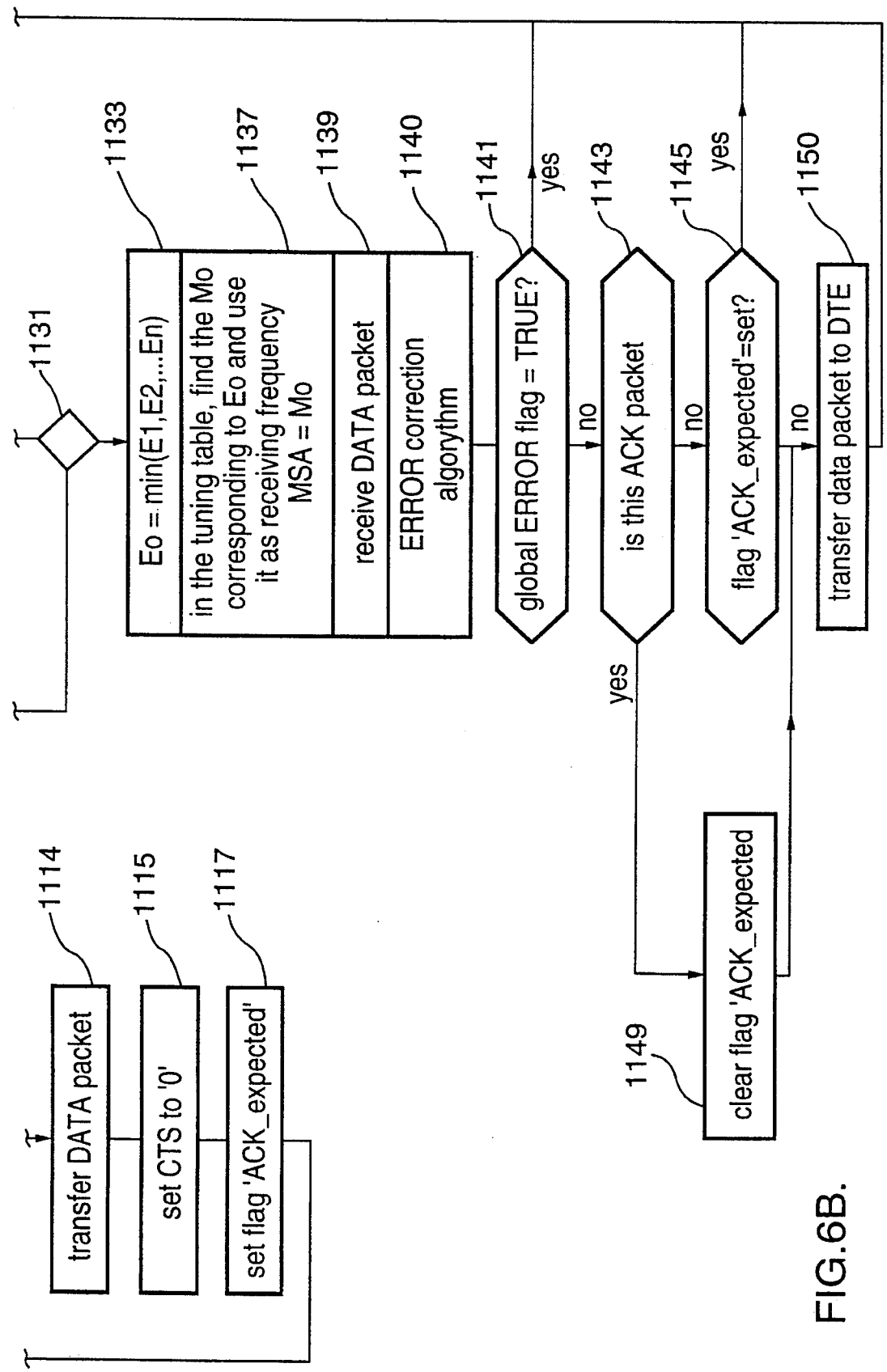
Figure 7A:
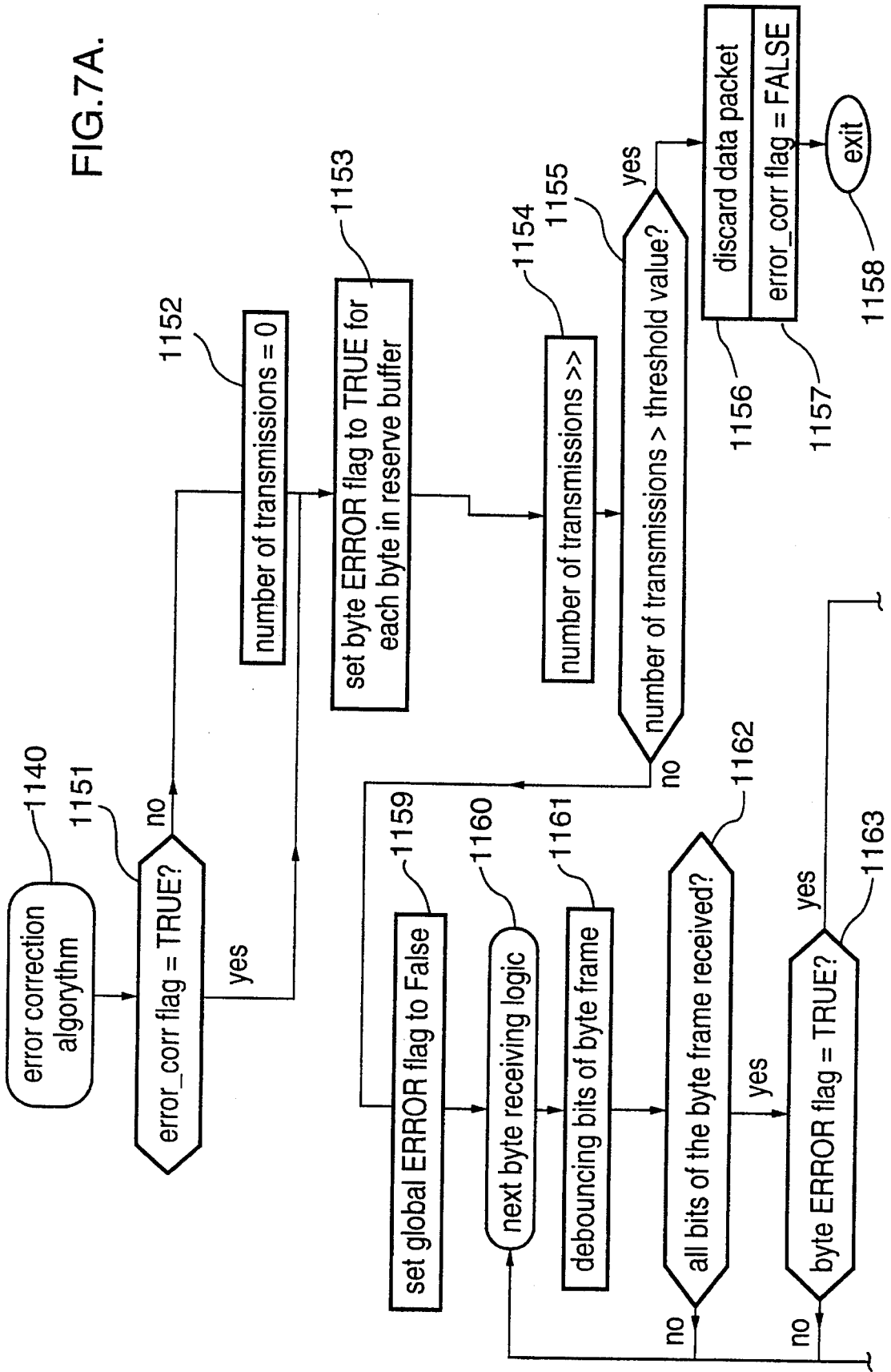
Figure 8:
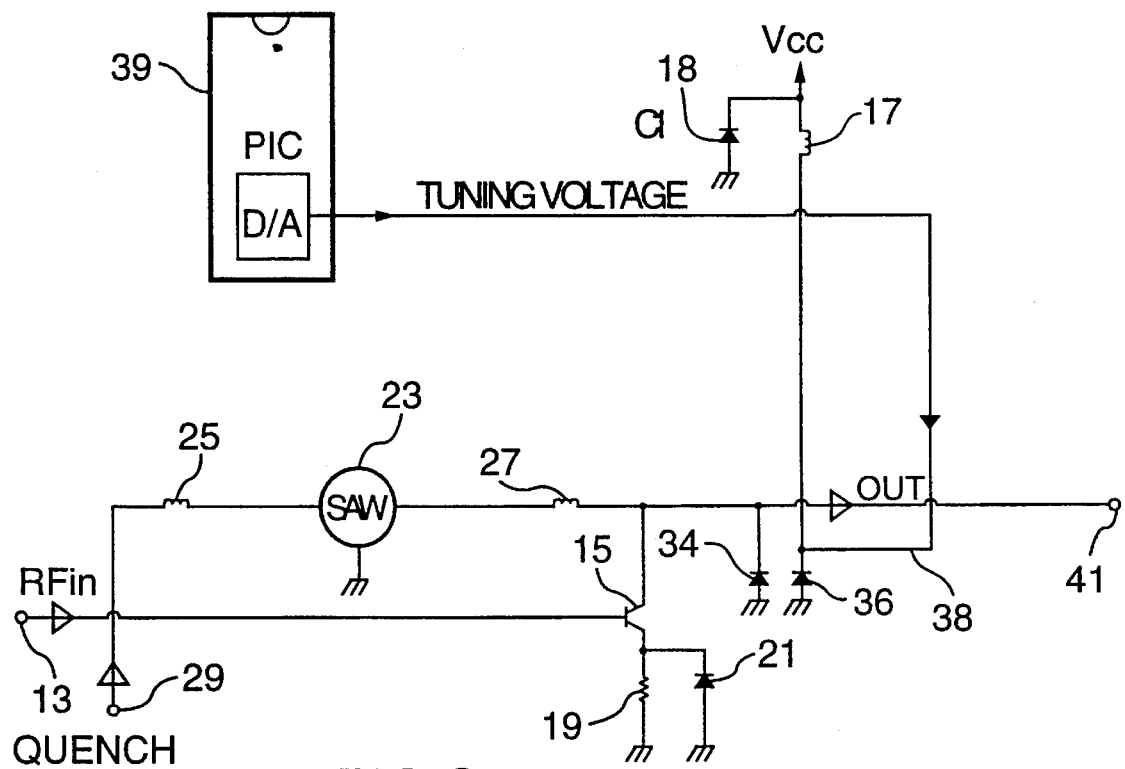
Figure 9:
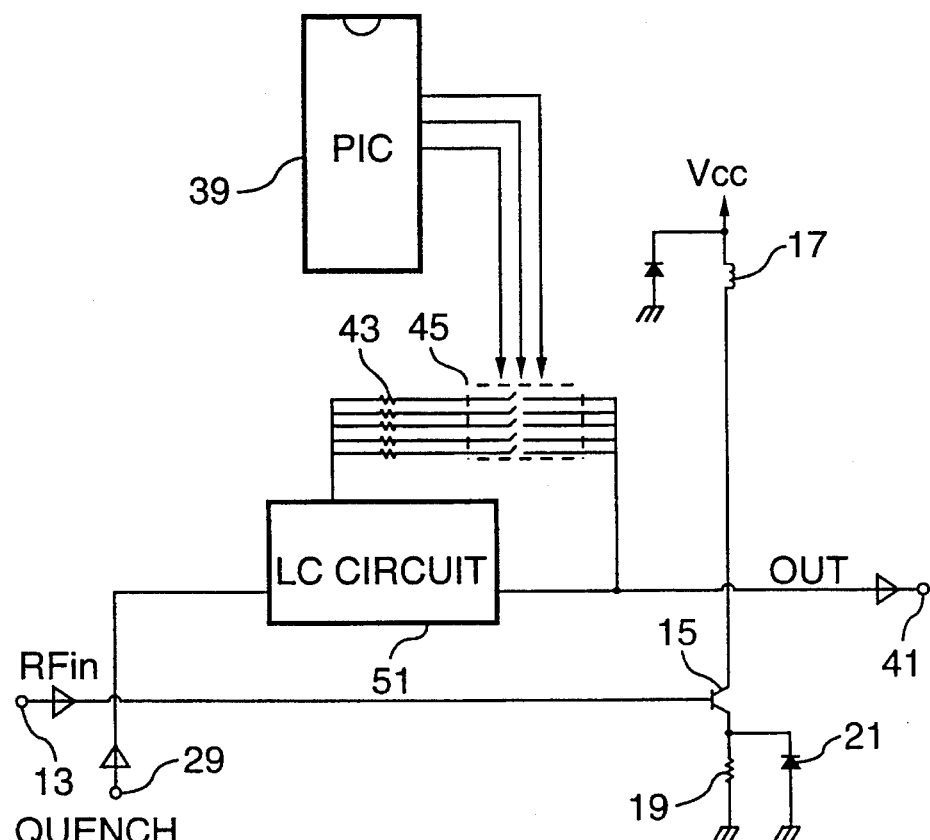
Figure 10:
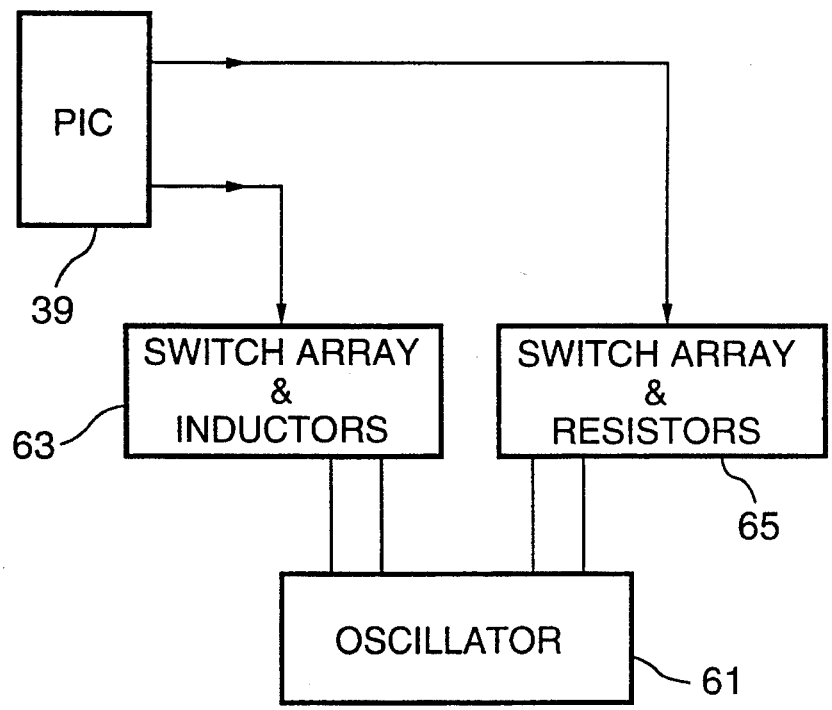
Figure 11:
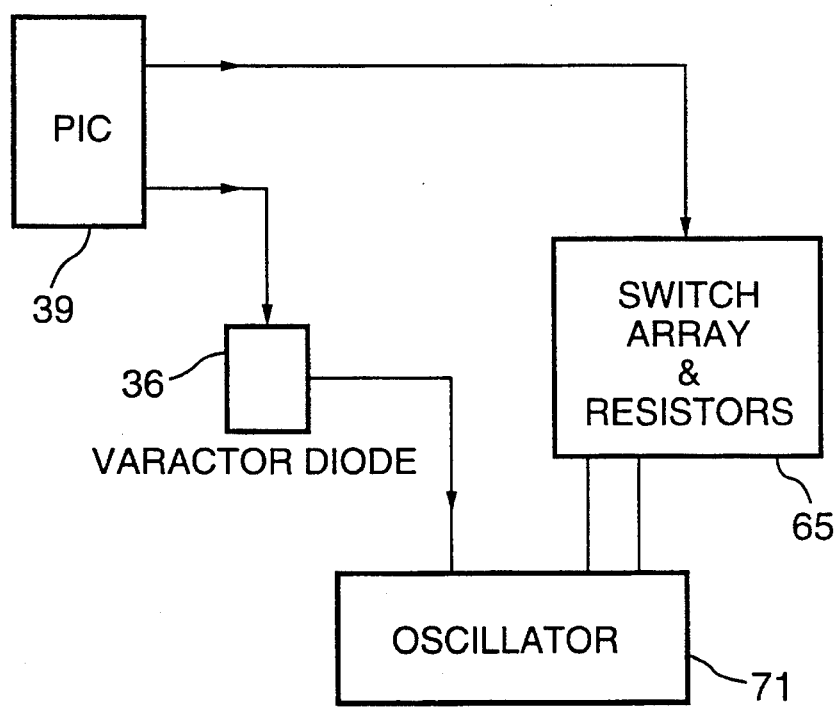
Figure 12:
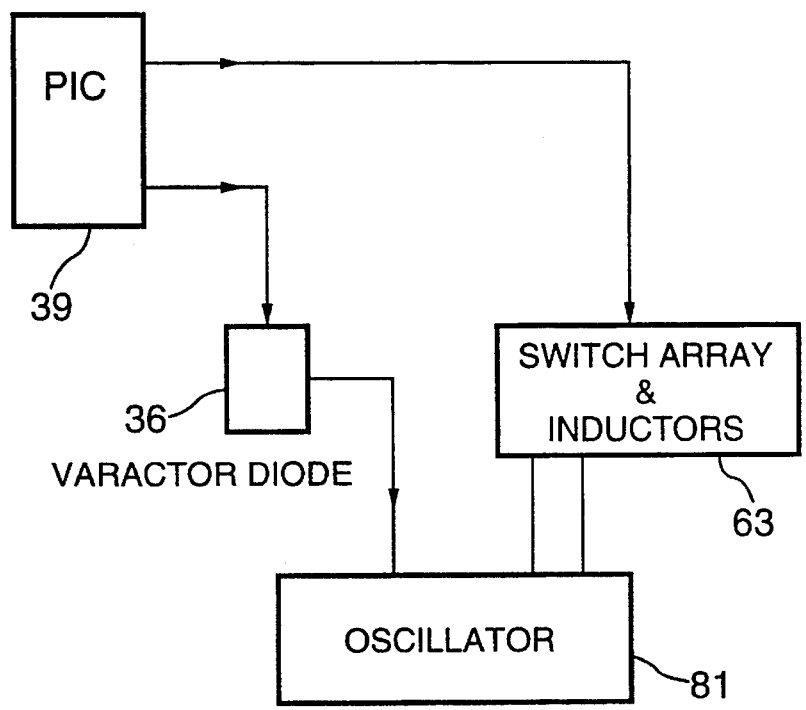
Figure 13:
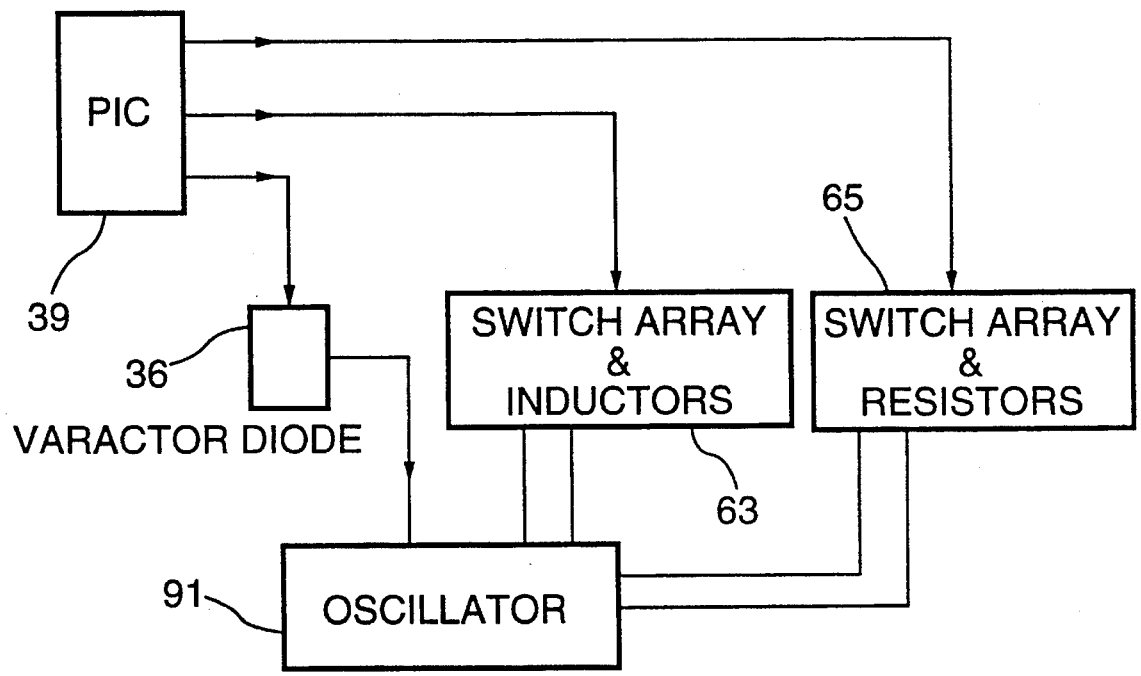

FIG. 3 is a block diagram of a transceiver according to the preferred embodiment of the present invention;

FIG. 4 is a timing diagram showing operation of a transmitter and receiver according to the principles of the present invention;

FIG. 5 shows the contents of a tuning table of bit errors and associated tuning impedance states in accordance with the present invention;

FIGS. 6A and 6B are a flow chart showing overall operation of the system according to the present invention;

FIGS. 7A and 7B are a flow chart showing an error correction function of the overall operation shown in FIG. 6;

FIG. 8 is a block schematic diagram of a capacitive adjustable configuration of the receiver according to a second embodiment of the invention;

FIG. 9 is a block schematic diagram of a resistive adjustable configuration according to a third embodiment of the invention;

FIG. 10 is a block diagram showing an inductive/resistive adjustable configuration of the receiver according to a fourth embodiment of the invention;

FIG. 11 is a block diagram showing a capacitive/resistive configuration of the receiver according to a fifth embodiment of the invention;

FIG. 12 is a block diagram showing an inductive/capacitive adjustable configuration of the receiver according to a sixth embodiment of the invention; and FIG. 13 is a block diagram showing an inductive/capacitive/resistive adjustable configuration of the receiver according to a seventh embodiment of the invention.

DETAILED DESCRIPTION OF THE INVENTION

Figure 1:
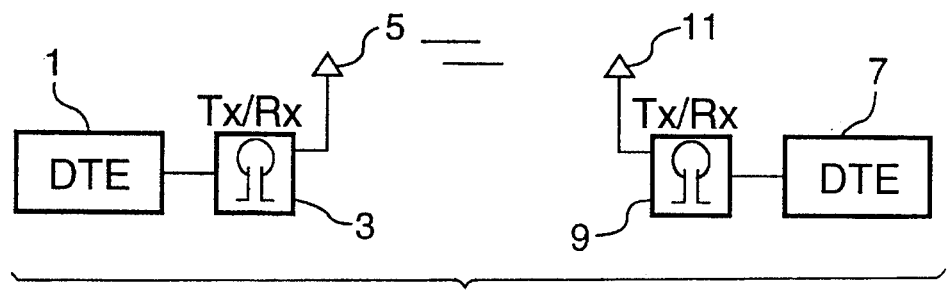
FIG. 1 is a block diagram of a transmitter and receiver adapted to implement the system of the present invention.

Turning to FIG. 1, a radio communication system is shown comprising a data terminal 1 connected to a transceiver 3 for transmitting and receiving radio frequency (RF) signals via an associated antenna 5. At a remote location, an associated data terminal 7, transceiver 9 and antenna 11 are provided.

Asynchronous serial communication is established between each of the data terminals 1 and 7, and the associated transceivers 3 and 9, respectively, (e.g. via RS-232 protocol). In the preferred embodiment of FIG. 1, data terminals 1 and 7 and transceivers 3 and 9 are of substantially identical construction so that bi-directional communication may be established therebetween. However, as discussed in greater detail below, the principles of the present invention apply equally to a system comprising a transmitter at one location and a receiver at another location. Indeed, the principles of the present invention also apply to a single transceiver and associated data terminal and antenna configured to operate as a transponder so that the transmitter portion of the transceiver generates and transmits a data signal which may be reflected off of a tag or other suitable means (with or without frequency shifting) and returned for reception via the receiver portion of the transceiver.

Figure 2:
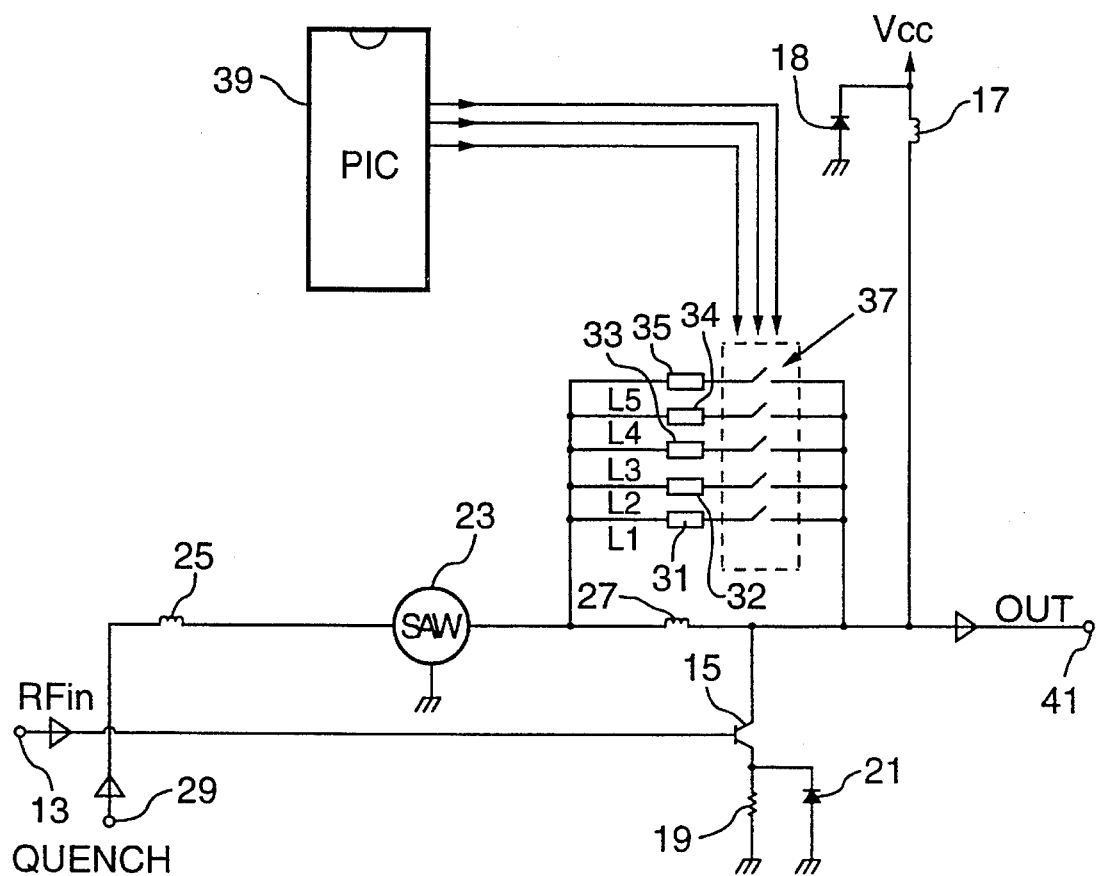
FIG. 2 is a block schematic diagram of an inductive adjustable configuration of the receiver according to a first embodiment of the invention.

The superegenerative receiver portion of each of the transceivers 3 and 9 is shown in greater detail with reference to FIG. 2.

A modulated $RF_{in}$ signal is received on an input 13 and is applied to the base of a transistor 15 connected in common emitter configuration. A collector terminal of transistor 15 is connected to a DC supply voltage Vcc via an inductor 17, and an emitter terminal thereof is connected to ground via an emitter biasing resistor 19 and also via an emitter bypass capacitor 21 for providing improved bias stability. A capacitor 18 is provided for filtering power supply noise.

A surface acoustic wave (SAW) device 23 is connected in a feed-back loop to the base terminal of transistor 15 via an inductor 25 and to the collector terminal of transistor 15 via an inductor 27. The SAW device 23 is used in a well known manner for providing low loss, temperature stable phase shift in the feedback circuit to cause oscillations, as discussed in greater detail below.

A QUENCH oscillation signal is received on a further input terminal 29 for application to the base of transistor 15.

In order to provide real time adjustable tuning of the receiver, a plurality of further inductors 31, 32, 33, 34, and 35 are connected via a microswitch array 37 in parallel with inductor 27. Inductors 31–35 are characterized by respective inductances L1–L5 for effecting fine tuning of the default centre operating frequency set by inductors 25 and 27 in the feedback circuit of transistor 15. A microcontroller 39 in the form of a programmable integrated circuit (PIC) provides control signals for causing the microswitch array 37 to connect all n possible parallel combinations of inductors 31–35 with inductor 27 (e.g. $n=2^5=32$ different states for five switches of array 37).

In operation, inductors 25 and 27 are chosen so that the feedback circuit comprising transistor 15, inductors 25 and 27 and the SAW device 23, begins oscillating at a frequency close to the desired default centre operating frequency when the QUENCH voltage is applied to the circuit via terminal 29. Upon receipt of the modulated $RF_{in}$ signal on input terminal 13, the signal due to the QUENCH voltage at the base of transistor 15 increases causing the transistor 15 to oscillate at a higher frequency. Each time the transistor 15 is enabled with each cycle of the QUENCH signal, the modulated $RF_{in}$ signal voltage is superimposed on the QUENCH voltage signal and is coupled to an output terminal 41. As discussed in greater detail below with reference to FIG. 3, envelope detectors, low frequency amplifiers and low pass filters are then used to demodulate the received signal.

The above discussion of operation of the oscillating circuitry provided by transistor 15, SAW device 23 and the inductors 25 and 27, does-not represent a departure from the operation of prior art superegenerative receivers. However, as will be discussed in greater detail below, the operation of microcontroller 39 and microswitch array (MSA) 37 for self-tuning the receiver centre operating system, is new.

Turning now to the block diagram of FIG. 3, the internal structure of transceiver 3 is shown in greater detail. The structure of transceiver 9 is identical to that of transceiver 3.

Considering the "transmit" portion of the transceiver shown in FIG. 3, a SAW resonator (not shown) provides a carrier frequency in local oscillator 301. A buffer amplifier 303 isolates the local oscillator from the output power amplifier 305. Output power amplifier 305 amplifies the signal from buffer amplifier 303 to a predetermined level capable of driving the antenna 5, in conjunction with a tuning and matching circuit 307, when antenna switch 309 switches antenna 5 to the transmit side of the transceiver.

The data stream of information to be transmitted is established via microcontroller 39 along with the destination address. Once real-time transmission is completed, the microcontroller 39 reverts to a sleep-mode or idle-loop which places the entire device into an extremely low quiescent current state for minimizing power consumption to less than 10 mA, so that a power switch is not required.

Turning to the "receive" portion of the transceiver, a signal received via antenna 5 is switched via antenna switch circuit 309 to a matching and tuning network 311. The received signal is amplified by a low noise high frequency preamplifier 313 for increasing the signal-noise-ratio and for preventing superegenerative oscillation radiation. A "hyperegenerative" amplifier 315 includes all of the components illustrated in FIG. 2 with the exception of microcontroller 39, and the superegenerative operating technique of amplifier 315 is as discussed above with reference to FIG. 2. However, for the purpose of this disclosure, the term "hyperegenerative" is used to denote the inventive aspect by which the receiver frequency is automatically selected and tuned under software control.

Envelope detector 317 recovers the modulated signal output from the selected centre operating frequency by means of a hot carrier diode (not shown) in a well known manner. A combination of low frequency amplifier 319 and low pass filter 321 then amplifies the demodulated signal to predetermined values which are sufficiently strong to drive a voltage comparator 323, from which the undecoded data stream is generated at TTL voltage levels.

Microcontroller 39 then decodes and verifies the data stream so that it is identical to that being transmitted, and rejects all other unwanted or arbitrary signals. Well known error detection and correction techniques may be used to accomplish this function (e.g. CRC codes, CHKSUM, etc.) However, it is preferred to use the error correction algorithm discussed in greater detail below with reference to FIG. 7. The reference voltage for comparator 323 (i.e. auto-adjustable threshold) is continuously adjusted by the microcontroller 39 according to the level of the signal relative to background noise level.

A quench oscillator 325 provides the necessary QUENCH frequency signal to the feed-back circuit of amplifier 315.

As discussed in greater detail below, microcontroller 39 operates in conjunction with the tuning network of inductors 31–35 and microswitch array 37 (FIG. 2) to adjust the centre operating frequency of signal reception.

Turning now to FIGS. 4–7 in combination with FIGS. 1 and 2, a detailed description is provided of the adaptive self-tuning, frequency selection and error correction aspects of the present invention.

When data terminal 1 wishes to transmit information to data terminal 7, an RS-232 control signal RTS (request to send) is transmitted to transceiver 3 via the asynchronous serial communication link therebetween. Microcontroller 39 within transceiver 3 then causes the transmit portion of the transceiver to generate and transmit n identical test sequences at a first carrier frequency (eg. fc1). The predefined test sequence is stored in both transceivers 3 and 9 and is used to tune transceiver 9 to an optimal centre operating frequency for the transmit carrier frequency of transceiver 3 (see FIG. 4).

Transceiver 9 receives the transmitted test sequences from transceiver 3 (referred as RTEST 1, RTEST 2, . . . RTEST n in FIG. 4) and compares each of the received test sequences with the original stored test sequence (TEST= TEST 1=TEST 2= . . . TEST n) stored within microcontroller 39 of transceiver 9. More particularly, upon receipt of the first test sequence (TEST 1), the microcontroller 39 in transceiver 9 compares the received test sequence RTEST 1 with the stored TEST 1 sequence for a first predetermined state of the microswitch array 37 under operation of microcontroller 39. Microcontroller 39 then counts the number of bit errors for that particular state of the tuning impedance array. The number of errors and the state of the array 37 (referred to herein as MSA 37) are stored in memory of the microcontroller for creating a tuning table (FIG. 5).

Before the second test sequence is received, microcontroller 39 changes the state of MSA 37 to provide a different selection of inductors 31–35 in parallel with inductor 27, thereby slightly changing the receiver centre operating frequency. Microcontroller 39 then compares the received test signal RTEST2 with the original test sequence TEST2, counts the number of bit errors for the new state (M2) of MSA 37 and stores the MSA state M2 and the number of bit errors (E2) in the internal tuning table (FIG. 5).

This procedure is repeated for all possible states of MSA 37 (i.e. n different values of inductivity in parallel with the main wire wound inductor coil 27). The resulting tuning table of FIG. 5 contains all n states of MSA 37 (M1, M2, . . . , Mn) and the corresponding numbers of bit errors (E1, E2, . . . , En), wherein each state of MSA 37 defines a discrete centre operating frequency of transceiver 9.

Microcontroller 39 then reviews the tuning table to ascertain which of the states of MSA 37 provides the least number of bit errors. Clearly, this state corresponds to the optimal receive centre operating frequency to the transmit carrier frequency (i.e. fc1) generated by transceiver 3. Once the optimum configuration of MSA 37 has been selected at the end of the generated test sequence, transceiver 3 transmits a clear to send (CTS) signal to data terminal 1 in response to which data terminal 1 begins transmission of the actual information data package for reception by the transceiver 9 and data terminal 7.

After the data package has been transmitted, transceiver 3 reverts to its receive mode of operation and waits to receive an acknowledgement packet (ACK packet) from the transciever 9 (i.e. an internal "ACK expected" flag is set), thereby indicating that the data packet was correctly received by DTE 7. If this ACK packet is not received within a predetremined time period, the local DTE 1 again raises its RTS signal and causes transceiver to retransmit the test sequence and dtat packet, but this time at a different frequency (e.g. fc2). According to the preferred embodiment, up to three retransmissions are undertaken at three different carrier frequencies (fc1, fc2 and fc3).

FIG. 6 is a flow chart illustrating the steps discussed above for carrier frequency selection, adaptive self-tuning of the receiver portion of transceiver 9 to match the transmit carrier frequency of transceiver 3, and error correction within the transceiver 9.

Microcontroller 39 begins operation in both transceivers 3 and 9 at step 1101, and executes an idle loop for polling the RS-232 input pin connected to the RTS control signal from respective data terminals 1 and 7 (step 1103).

As discussed above, when data terminal 1 wishes to send a data packet, it raises the RTS voltage to a logic high value. Microcontroller 39 of transceiver 3 detects the logic high value at step 1103 and then checks whether the internal flag "ACK expected" has been set (step 1104). Initially, the "ACK expected" flag is cleared, so that the microcontroller 39 begins a transmit subroutine comprising steps 1109 to 1117 at the first carrier frequency (i.e. fc1).

In the transmit subroutine, microcontroller 39 modulates the transmitter portion of the transceiver with the above-discussed test sequence n times (i.e. by executing the FOR loop provided by steps 1109, 1110, 1111 and 1112). After that, microcontroller 39 raises the CTS (Clear To Send) signal (step 1113) to let the data terminal know that transmission of data information packages can begin. Microcontroller 39 then transfers the data package (step 1114) to the transceiver for transmission, clears the CTS flag (step 1115) and sets the "ACK expected" flag (step 1117).

If after a predetermined time period, no ACK packet has been received from the remote data terminal 7 (i.e. indicating that the data was not correctly received at DTE 7), DTE 1 again raises its RTS signal to begin retransmission of the test sequence and data packet. However, this time, since the internal "ACK expected" flag is set (step 1104), then at step 1108 the centre transmission frequency is changed (eg. to fc2), prior to begining transmission of the test sequence. As indicated above, if after sending the test sequence and data packet at the fc2 carrier frequency and still no ACK packet is received from DTE 7, then RTS is raised again by DTE 1, causing retransmission of the test sequence and data packet at the third carrier frequency fc3 (step 1108).

Turning to the receiver operation of transceiver 9 at the remote location for the scenario discussed above, the RTS signal is not initially at a logic high level, and the internal microcontroller 39 polls the input pin connected to the receiver portion of the transceiver 9 (step 1152) in order to determine whether data is being received from remote transceiver 3 at the first predetermined frequency (i.e. the start bit is detected at the receiver output: $R_x(fc1)$="1"). If data is not being transmitted at the first frequency (i.e. a frequency of "fc1"), then at step 1154 microcontroller 39 detects whether data is being received from the remote transceiver 3 at the second predetermined frequency (i.e. the start bit is detected at the receiver output: $R_x(fc2)$="1"). If data is not being transmitted at the second frequency (i.e. a frequency of "fc2"), then at step 1156 microcontroller 39 detects whether data is being received from the remote transceiver at the third predetermined frequency (i.e. the start bit is detected at the receiver output: $R_x(fc3)$="1"). If the microcontroller determines that data is not being received at any of the first, second or third frequencies (fc1, fc2 or fc3), then microcontroller 39 continues in the idle loop.

At the remote data terminal 7, the RTS voltage is initially at a logic low value in the scenario discussed above (i.e. it is waiting to receive data from DTE 1), and the test sequence and data packet are in the process of being transmitted by DTE 1. Thus, a signal is detected in the receiver portion of the transceiver 9 (i.e. $R_x(fc1)$="1" in step 1152), thereby initiating a receive subroutine comprising steps 1119 to 1139.

At step 1121, a FOR loop is executed, beginning with microcontroller 39 defining the first state of MSA 37 at step 1122 (i.e. MSA=M1 which designates a specific combination of chip inductors 31–35 for defining a first receiver centre operating frequency). Next, the first test sequence (RTEST1) is received (step 1123). At step 1125, the stored test sequence (TEST 1) and the received test sequence (RTEST 1) are compared for transmission errors, the number of bit errors bits (El) is calculated, and M1 and E1 are written to the tuning table of FIG. 5 (step 1129) within microcontroller 39. The same procedure is repeated in the next loop iteration and as a result the second state of MSA 37 (M2) and the corresponding number of errors (E2) (i.e. the difference between RTEST2 and TEST sequences) is written to the tuning table.

Once all n states have been processed (i.e. at the end of the FOR loop comprising steps 1121 to 1131), the minimum bit error value Ea=min [E1, E2, . . . , En] is located in the tuning table and the corresponding state of MSA 37 is determined (step 1133). This state of MSA 37 is selected as the operating state (Mo) in step 1137 and thereby defines the receiver centre operating frequency which is optimally tuned to the remote transmit carrier frequency. Then, the data package is received (step 1139).

Error correction is then performed on the received data, as discussed in greater detail below with reference to FIG. 7. If the data has been correctly received (i.e. global ERROR flag is false), then the microcontroller 39 queries at step 1143 whether the received packet is an ACK (i.e. acknowledgement) packet. If the received packet is the ACK packet, indicating an end to the data transmission (i.e. the "yes" branch from step 1143), then the "ACK expected" flag in microcontroller 39 is cleared and the data is transmitted to the DTE 7 (step 1150). If the received flag is not the ACK packet (i.e. the "no" branch from step 1143) then at step 1145 micocontroller 39 queries whether the internal "ACK expected" flag is set (i.e. has the transceiver sent a data packet which has not yet been acknowledeged?), and if not transmits the data packet to the associated DTE (step 1150). After the data packet has been transferred to DTE 7, program floww returns to step 1103 to await receipt of further data or a request to send (RTS=1) from the DTE 7.

If either the data packet has been received incorrectly (i.e. the "yes" branch from step 1141) or the data packet has been received correctly but the microcontroller 39 determines that the received packet is not the ACK packet and that an acknowledgement is expected (i.e. the "yes" branch from step 1145), then program flow returns to the beginning (step 1103).

Turning now to FIG. 7, the error correction algorithm of step 1140 in FIG. 6, is shown in greater detail.

At step 1151, an internal "error-corr" flag is tested to see if it has been set at "true" (see steps 1157, 1172 and 1176, below). A "true" setting of the error-corr flag indicates that the previous data packet was incorrectly received and is not being retransmitted. Thus, if the error-corr flag is not true (i.e. the "no" branch from step 1151), then the number of transmissions is cleared to zero (step 1152). If the error-corr flag is set at true (i.e. the "yes" branch from step 1151), or after the number of transmissions has been set to zero (step 1152) where the error-corr flag is not true, then the byte error flag is set to true for each byte in the receive buffer of the transceiver 9. According to the preferred embodiment, the transceiver incorporates a 100 byte receive buffer and an associated 100 bit array containing the byte error flag for each byte of the 100 byte receive buffer. In other words, each byte has a flag associated therewith for indicating whether the received byte contains an error (i.e. byte error flag is set to true).

In step 1154, the number of transmissions is incremented (i.e. where the error-corr flag is not true (step 1151)), the internal counter which stores the number of transmissions is incremented from zero (step 1152) to 1 (step 1154), and where the error-corr flag is true (step 1151), the counter .containing the number of transmissions is incremented from its previous value.

In step 1151, the number of transmissions is compared to a predetermined threshold value. If the threshold value has been exceeded, indicating a defective channel, the data packet is discarded (step 1156) and the error-corr flag is set to false. Program flow then exits the error correction algorithm at step 1158, and returns to step 1141 of FIG. 6.

If the number of transmissions has not yet exceeded the predetermined threshold value (i.e. the "no" branch from step 1155), then the global error flag is set to false (step 1159). The transceiver 9 then receives the next byte of data (step 1160) and debounces the bits of the byte frame (step 1161). If all bits of the byte frame have not yet been received (i.e. the "no" branch from step 1162), then the next byte of the data packet is received (i.e. program flow loops back to step 1160). This loop is continued until all bits of a data byte have been received. Once the entire data byte has been received in the receive buffer (i.e. the "yes" branch from step 1162), then microcontroller 39 queries whether the byte error flag for this byte is true (step 1163). As discussed above, the byte error flag is initially set to true for each byte in the receive buffer. Thus, initially, program flow proceeds to step 1164 where the microcontroller 39 determines whether a framing error has occurred (step 1164). If not, microcontroller 39 determines whether a parity error has occurred (step 1165). If not, microcontroller 39 resets the byte error flag for this byte to false (step 1166). The received byte is then transmitted into the receive buffer (step 1167). Next, at step 1168, microcontroller 39 determines whether the received byte is an ETX byte (end of transmission). If not, the next databyte is received (i.e. program flow returns to step 1160). The program loop from step 1160 to step 1168 is continued until all of the 100 bytes of the receive buffer have been filled.

If either a framing error or a parity error are detected at steps 1164 and 1165, respectively, the global error flag is set to true (step 1169) and the byte error flag for the particular byte is also set to true (step 1170).

Once the ETX byte has been received (i.e. the "yes" branch from step 1168), microcontroller 39 determines whether the global error, flag is true (step 1171). If the global error flag is true, indicating that at least one of the received bytes contained a framing error or parity error, then the error correct flag is set to true in step 1172, and program flow exits from the error correction algorithm (step 1158). As discussed above, upon retransmission of the data packet, the "yes" branch will be taken at step 1151.

If the global error flag is not true at step 1171, indicating that there are no framing errors or parity errors in any of the received 100 bytes of data, then a check sum calculation is performed at step 1173. If the check sum calculation fails (i.e. the "no" branch from step 1174), then the error correct flag is set at true (step 1172), and program flow exits the error correction algorithm (step 1158).

If the check sum calculation is successful (i.e. the "yes" branch from step 1174), the global error flag is set to false (step 1175) and the error correct flag is set to false (step 1176), and program flow exits the error correction algorithm (step 1158), for returning to step 1141 of FIG. 6. In this scenario, the "no" branch will be taken from step 1141.

Although the preferred embodiment has been described with reference to an impedance tuning network comprised of a plurality of inductors 31–35 connected to the switch array 37, the principles of the present invention apply equally well in tuning the receiver centre operating frequency via an adjustable capacitance, as shown in FIG. 8. A capacitor 34 is connected to the collector terminal of transistor 15 for providing a temperature compensating element to compensate for drift incurred by the transistor. A variable capacitor 36 (e.g. a varactor diode) is also connected to the collector terminal of transistor 15 in parallel with temperature compensating capacitor 34. A tuning voltage is generated by means of an internal digital-to-analogue converter within microcontroller 39, and is applied to varactor diode 36 via a current limiting resistor 38. The capacitance of varactor diode 36 changes in response to the current applied thereto. Thus, by increasing or decreasing the tuning voltage at the input of resistor 38, the current through the varactor diode changes, thereby causing the receiver centre operating frequency to change. Thus, the difference in the embodiment of FIG. 8 from that shown in FIG. 2 is that instead of providing n different states of MSA 37, the receiver centre operating frequency is defined by the tuning voltage applied to varactor diode 36. This voltage is controlled by microcontroller 39 for defining n different analogue values to create a tuning table with n pairs of control voltages and a corresponding number of bit errors (each control or tuning voltage determines a capacitance of varactor diode 36, and thereby adjusts the receiver centre operating frequency).

In addition to the capacitive adjustable configuration of FIG. 8, various other configurations are possible for providing n different tuning impedances in the receive portion of the transceiver. Precisely the same methodology is utilized for selecting a transmission carrier frequency, generating test sequence bytes, receiving and comparing the test sequence bytes with the stored predefined sequence of test bytes, creating a tuning table and determining the appropriate impedance for an optimal match between the receiver centre operating frequency and the remote transmitter carrier frequency, and performing error correction in each of the embodiments illustrated in FIGS. 9–13.

In FIG. 9, the receiver tuning impedance is selected utilizing an LC circuit 51 in combination with a plurality of resistors 43 connected in parallel with LC circuit 51 to a switch array 45 (similar to switch array 37 in FIG. 2).

For ease of illustration, in FIGS. 10–13, the details of the superegenerative oscillator (inputs 13, 29, inductors 25, 27, SAW device 23, transistor 15, resistor 19, capacitor 21, capacitor C1, inductor 17, source of voltage Vcc and output terminal 41) are replaced by oscillator blocks 61, 71, 81 and 91, respectively.

In FIG. 10, switch array and inductors block 63 corresponds to inductors 31–35 and an MSA 37 in FIG. 2, and the switch array and resistors block 65 corresponds to resistors 43 and MSA 45 in FIG. 9. Thus, the inductive/resistive configuration of FIG. 10 utilizes a combination of inductors and resistors to provide the appropriate tuning impedance, with blocks 63 and 65 operating under control of microcontroller 39.

Similarly, the capacitive/resistive configuration of FIG. 11 utilizes a switch array and resistors block 65 in combination with varactor diode 36 to provide an appropriate tuning impedance under control of microcontroller 39.

Finally, FIGS. 12 and 13 illustrate a combination of varactor diode 36 and switch array and inductors block 63, and a combination of varactor diode 36, switch array and inductors block 63 and switch array and resistors block 65, respectively, for setting the appropriate receive centre under operating frequency control of microcontroller 39.

Other embodiments and modifications of the invention are possible. For example, although in the preferred embodiment an identical arrangement of bitts is used for each test sequence (i.e. TEST=TEST 1=TEST 2=. . . TEST n), it is contemplated that each test sequence may incorporate a different bit arrangement, provided that the identical test sequences are stored in both transceivers 3 and 9. Also, whereas the preferred embodiment has been described in terms of a superegenerative AM transceiver, the adaptive carrier frequency tuning and carrier frequency selection techniques of the present invention may be applied advantageously to well known superheterodyne AM and FM signal transmission and reception.

Although such embodiments and modifications are within the sphere and scope of the claims appended hereto.

I claim:

1. For use with a transmitter adapted to transmit an information signal on an optimal one of a plurality of carrier frequencies and a receiver adapted to receive said information signal, a method for selecting said optimal one of said plurality of carrier frequencies and self-tuning said receiver relative to said optimal one of said carrier frequencies, comprising the steps of:

a) storing within said receiver a plurality of test sequences;

b) generating within said transmitter and transmitting identical versions of said plurality of test sequences at one of said plurality carrier frequencies;

c) selecting within said receiver respective ones of a predetermined number of tuning impedances equal in number to said plurality of test sequences for tuning said receiver to receive respective ones of said test sequences at respective centre operating frequencies in a narrow frequency band around said one of said plurality of carrier frequencies;

d) comparing within said receiver said test sequences received at said respective centre operating frequencies with said test sequences stored within said receiver, determining which one of said tuning impedances results in a least mismatch between said received test sequences and said stored test sequences, and selecting said one of said tuning impedances for receiving said information signal at an associated one of said centre operating frequencies which is optimally matched with said one of said plurality of carrier frequencies;

e) generating within said transmitter said information signal at said one of said plurality of carrier frequencies;

f) receiving within said receiver said information signal at said associated one of said centre operating frequencies and detecting whether said information signal has been correctly received, and in the event said information signal has been correctly received transmitting an acknowledgement signal to said transmitter, and in the event said information signal has not been correctly received monitoring for a subsequent transmission from said transmitter at a further one of said plurality of carrier frequencies;

g) detecting within said transmitter the presence of said acknowledgement signal from said receiver, and i) in the event of detection of said acknowledgement signal then confirming the selection of said one of said plurality of cartier frequencies as said optimal carrier frequency, and ii) in the event of an absence of detection of said acknowledgement signal then selecting said further one of said plurality of cartier frequencies and repeating steps b) through g).

* * * * *